(12) United States Patent
Rouberol

(10) Patent No.: US 6,379,569 B1
(45) Date of Patent: *Apr. 30, 2002

(54) PROCESS FOR ETCHING A CONDUCTIVE LAYER

(75) Inventor: Marc Rouberol, Hoboken, NJ (US)

(73) Assignee: Saint-Gobain Vitrage (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 72 days.

(21) Appl. No.: 09/255,839

(22) Filed: Feb. 23, 1999

(30) Foreign Application Priority Data

Feb. 23, 1998 (FR) .............................. 98/02138

(51) Int. Cl.$^7$ .............................................. H01B 13/00
(52) U.S. Cl. .............................. 216/13; 216/16; 134/902
(58) Field of Search .............................. 134/902; 216/13, 216/16

(56) References Cited

U.S. PATENT DOCUMENTS

| | | | |
|---|---|---|---|
| 1,832,716 A | 11/1931 | Lopez | |
| 2,089,571 A | 8/1937 | Polasik | 41/43 |
| 3,369,253 A | 2/1968 | Sihvonen | 346/76 |
| 3,489,624 A | 1/1970 | Lake et al. | 156/15 |
| 3,615,465 A | 10/1971 | Bullinger | 96/36.2 |
| 3,837,944 A | 9/1974 | Cole, Jr. | 156/4 |
| 4,683,044 A | * 7/1987 | Shimizu et al. | 204/192.26 |
| 4,835,208 A | * 5/1989 | Ball | 524/478 |
| 5,614,353 A | * 3/1997 | Kumar et al. | 430/313 |
| 5,776,844 A | 7/1998 | Koch et al. | 501/70 |
| 5,897,924 A | * 4/1999 | Ulczynski et al. | 427/577 |

FOREIGN PATENT DOCUMENTS

| | | |
|---|---|---|
| EP | 854117 | 7/1998 |
| WO | WO 96/11887 | 4/1996 |

* cited by examiner

Primary Examiner—Randy Gulakowski
Assistant Examiner—Michael Kornakov
(74) Attorney, Agent, or Firm—Pennie & Edmonds LLP

(57) ABSTRACT

The invention relates to a process for chemically etching a layer (2) having electrical conduction properties, on a transparent substrate (1) of the glass type. It includes at least one step of depositing a mask (3) comprising at least one hot-melt ink on the layer to be etched.

23 Claims, 1 Drawing Sheet

PROCESS FOR ETCHING A CONDUCTIVE LAYER

BACKGROUND OF THE INVENTION

Figure 1:
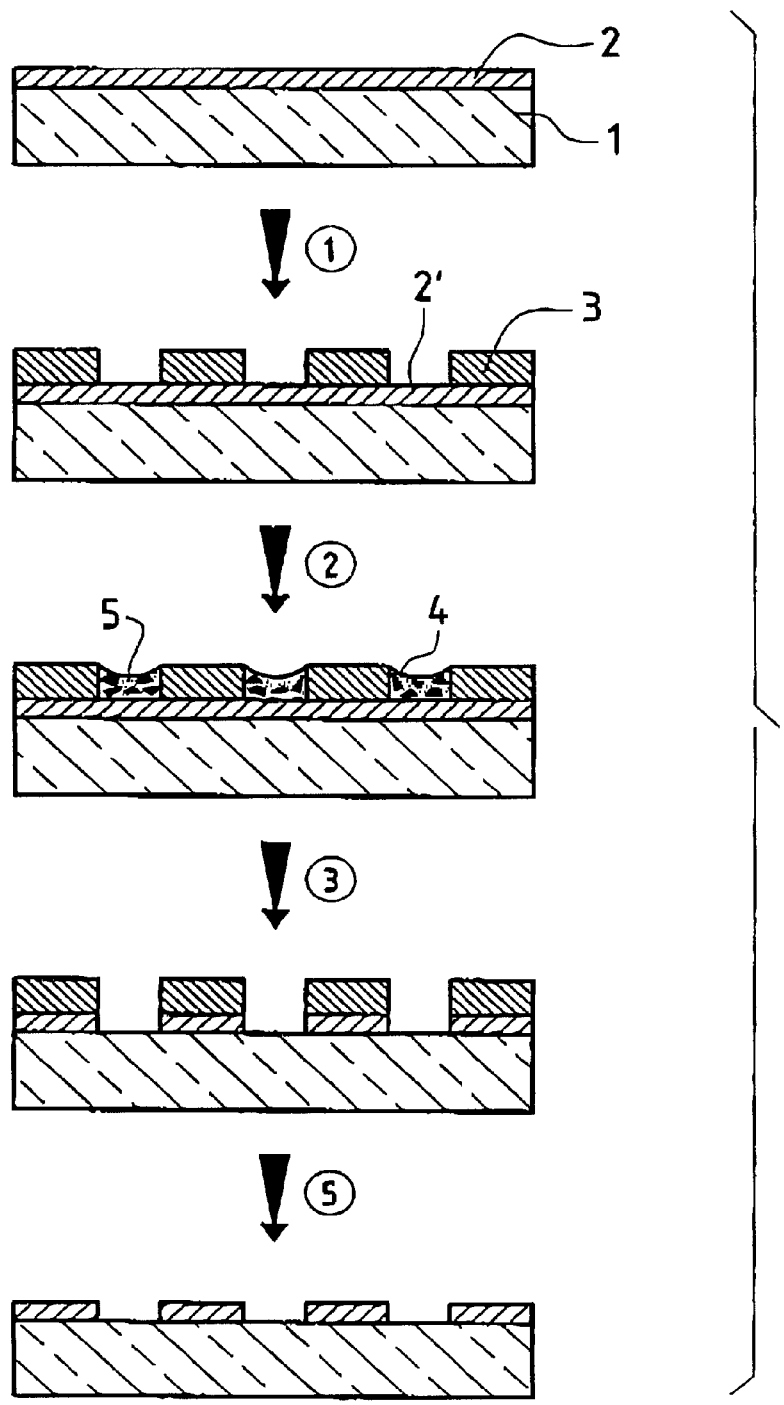

The invention relates to a process for etching layers which are deposited on transparent substrates such as glass substrates, and more particularly layers with at least moderate electrical conductivity with a view to obtaining electrodes or conducting elements.

The invention deals in particular with layers based on doped metal oxide or based on metal, and preferably those which by virtue of their inherent characteristics and their thicknesses, are transparent. It does not, however, exclude opaque layers.

Many products based on glass substrates do indeed need conducting elements with particular patterns, having good or very high resolution. That is, for example, the case of the electrodes of the glass of emissive screens of the flat screen type, the electrodes of photovoltaic cells or the networks of conducting elements in heated windows or windows incorporating antennas.

U.S. Pat. No. 3 837 944 discloses a technique for chemically etching conducting metal oxide layers, consisting firstly in depositing, on the layer to be etched, a continuous layer based on a resin referred to as "photoresist" which needs to be exposed through a frame, developed then rinsed so as to obtain a mask having the desired pattern. Chemical attack is then carried out on the regions of the layer which are not covered by the resin.

It can be seen that, using this technique, obtaining the mask is complicated and needs a considerable number of steps. It is furthermore unsuitable for small runs, because a new frame needs to be created for each pattern, and unsuitable for substrates with large dimensions.

SUMMARY OF THE INVENTION

The object of the invention is therefore to overcome these drawbacks, in particular by providing a novel type of chemical etching which has better performance, an in particular is more flexible to implement, simpler and faster.

The invention relates to a process for chemically etching a layer having electrical conduction properties, of the doped metal oxide type, on a transparent substrate of the glass type, and which includes at least one step of depositing a mask comprising at least one hot-melt ink on the layer to be etched (the term "hot-melt" ink includes all the inks comprising thermoplastics polymers/materials).

The invention will be described in more detail below with reference to non-limiting examples which are illustrated by the following FIGURE:

FIG. 1: a schematic representation of the steps in the etching process according to the invention.

DETAILED DESCRIPTION OF THE INVENTION

In the context of the invention, "having electrical conduction properties" is intended to mean layers having a resistivity of at most $4.0^{-2}$ $\Omega$.cm, in particular from about $4.10^{-3}$ $\Omega$.cm to $4.10^{-4}$ $\Omega$.cm at least. More particularly relevant layers with at most 1000 $\Omega/^2$ and preferably at most 50 $\Omega/^2$, with layer thicknesses of generally between 100 and 300 nm.

The etching of such layers actually makes it possible to obtain networks of electrodes with a variety of applications. It is, however, obvious that the etching technique of the invention may equally well be applied to layers with low or zero conductivity, of the dielectric type, for example undoped metal oxide, should it be advantageous to etch them, in particular for decorative purposes.

The utilization of a mask based on hot-melt ink, for example deposited by an inkjet printing technique, is extremely advantageous for various reasons: firstly, the mask can be directly deposited with the desired pattern, in a single step, taking much less time than the deposition technique described above which involves at least three steps for obtaining the desired mask. Secondly, this mask is well suited to small runs, and sizeable numbers of frames do not need to be stored. This is because, for each new pattern, all that needs to be done is to reprogram the deposition machine, which is advantageously driven by electronic/computer means, and simply have it store the patterns. Finally, it is relatively easy to deposit this type of mask on substrates with large dimensions.

It was, however, far from certain that depositing the mask by printing with hot-melt ink would give convincing results. Indeed, this type of ink had hitherto been used for quite a different application, namely the permanent marking of objects. In the context of chemical etching, these inks would have to withstand highly aggressive corrosive chemical attack, and on the other hand they would have to be removable with ease after etching, which requirements were not all required or desired in an application involving the marking of standard objects.

Nevertheless, it was quite unexpectedly found that hot-melt inks, if suitably selected, meet all these requirements.

The thickness of the mask which is deposited can vary according to different criteria, and may for example by from 20 to 60 $\mu$m.

These inks advantageously comprise one or more essentially organic waxes. The term "wax" is known in the field of inkjet printing, and generally comprises long-chain polymers such as aliphatic carbon-based polymers. Mention may more particularly be made of the family of polyolefins such as polypropylene, polyethylene as well as paraffin and polystyrene. These inks may also comprises a number of additives, of the plasticizer type such as ethylene vinyl acetate EVA, antioxidants or colorants.

The advantage of the inks selected according to the invention is that they have a melting temperature of at least 60° C., in particular at least 75° C., preferably between 75 and 100° C., or 75 and 85° C.; deposited hot in the liquid phase on the layer to be etched, they cook extremely rapidly to solidify on the layer with the desired pattern.

They are preferably chosen to be insoluable in water, more particularly if the chemical attack on the layer involves an aqueous solvent. Similarly, they are advantageously resistant to attack by nascent hydrogen, which can be used to obtain the desired chemical attack on the layer in the regions not covered by the mask.

The etching process according to the invention is preferably carried out using the following successive phases:

(a) deposition of the mask comprising at least one hot-melt ink on the layer to be etched (directly with the desired pattern), (b) attack on the layer in the regions without the mask by nascent hydrogen (that is to say: either nascent hydrogen is generated only in the unmasked regions, or, more simply, nascent hydrogen is generated unselectively, or less selectively, but with the attack nevertheless concentrated on the unmasked regions, the masked regions being protected against corrosive attack by hydrogen), (c) optionally, a treatment of cleaning the substrate with the layer (in particular to remove the excessive materials/solvents used to generate the nascent hydrogen), (d) removal of the mask.

According to a first variant of the invention, the nascent hydrogen is generated by combining zinc, in particular in powder form, with a strong acid. The operation is generally carried out in two steps, namely bringing the regions of the layer which are free of the mask into contact with powdered zinc, then with a solution having an acidic pH, or vice versa.

The powdered zinc may be projected onto the layer in the solid phase, using a known powder-dispensing nozzle.

The powdered zinc may also be projected onto the layer in the liquid or fluid phase or in an aerogel type emulsion, in particular by suspending the zinc powder in one or more organic solvents, such as terpineol, and/or aqueous solvents, optionally provided with additives, more particularly such as to modify the rheology, for example aerosil. It is advantageous to select the solvents so that they are compatible with and soluble in the solution carrying the strong acid, so as to promote the reaction between the zinc powder and the acid. The zinc may thus be projected in suspension using various techniques, in particular by spraying (using a device for spraying a solution in droplets), or by screen printing.

It is also conceivable to bring the layer to be etched into contact with the zinc by depositing a thin layer of zinc on the layer once it has been masked, for example depositing it using a vacuum technique such as sputtering.

As regards the solution having an acidic pH, it may comprise at least one aqueous or organic solvent of the alcoholic type, and may preferably be based on an aqueous-alcoholic mixture such as water+ethanol or isopropanol. It has in fact been found that adding alcohol to water containing the acid allows better control over the size of the hydrogen bubbles created on contact with the zinc, and in particular in order to reduce the size of these bubbles in order to bring about "gentler" attack on the layer (and thus to prevent any risk of the mask's detaching under the mechanical action of the $H_2$ bubbles). As a supplement to the alcohol, or instead of it, this effect may also be obtained by adding suitable additives such as anionic, cationic or nonionic surfactants.

The acid preferably chosen is a strong acid such as HCl. Advantageously, a percentage by mass of the order of 1 to 20%, in particular of the order of 1 to 10%, may be chosen for the acid such as HCl in the solution, which corresponds to a concentration which is not extremely high, this being good for preventing premature corrosive wear of the equipment in contact with the solution, but is nevertheless a sufficient concentration to obtain the desired etching.

The contact between the solution having an acidic pH and the layer to be etched may for example be brought about by a spraying technique or by immersing the substrate in a bath of the solution. It may thus be advantageous to use a spray technique for depositing both the solution containing the zinc and the solution containing the acid, in terms of equipment simplicity and compactness of the manufacturing line, it thus being possible for the substrate to move at the appropriate speed under one spray nozzle, then under the other.

According to a second variant of the invention, the nascent hydrogen is generated by bringing the regions of the layer which are free of the mask into contact with aluminum, in particular in powder form, then with a solution having an alkaline pH, or vice versa. The projection of the powdered aluminum may be carried out like the projection of the zinc, described above. Similarly, the layer to be etched may as an alternative be brought into contact with the aluminum by depositing a thin layer of Al on the layer once masked, using a technique such as sputtering. As for the alkaline solution, the same type of solvent and the same type of projection technique may be chosen as for the aforementioned acidic solution, this time using a base rather than an acid, in particular a strong base such as NaOH.

Phase (c) involving the cleaning treatment may simply consist in rinsing the layer, in particular in order to remove the residues of metal powder, acid or base. This may be done using a spray or by immersing the substrate, using a cleaning solution based on water and/or organic solvent.

The mask can be removed in a variety of ways. Without implying any limitation, a chemical route may firstly be chosen, by dissolving it in a suitable solvent, in particular an essentially organic solvent. The latter may be toluene, oil of turpentine, trichloromethane or butyl acetate.

If there is a desire to avoid having to reprocess organic waste, it will be better to favour other routes: this may involve an ultrasonic treatment, albeit this is predominately reserved for substrates with moderate dimensions. It may also involve a heat treatment, by directing a hot air blade, for example, onto the moving substrate: the blade softens the mask which becomes liquid and is removed by blowing air. Another solution consists in passing the substrate through an oven, for example at at least 250° C., in particular at temperatures of the order of 400 to 450° C. in order to burn off the mask and destroy it. The advantage with such a treatment at a very high temperature is that it can be carried out concomitantly with another heat treatment which is moreover to be applied to the substrate or one or other of the coatings with which it may be provided, independently of the etching process. This is, for example, generally the case with the glass substrates used in electronics, for example those involved in the construction of emissive screens, in which the panes have to undergo at least one heat treatment at high temperature with a view to stabilizing them dimensionally.

Another technique consists in softening the mask by a heat treatment at moderate temperature in order to facilitate its detachment, then in peeling it off by mechanical traction.

The etching process according to the invention can etch a wide variety of layers, in particular doped metal oxide layers such as tin oxide doped with fluorine $SnO_2$:F, tin oxide doped with arsenic $SnO_2$:As, or with antimony $SnO_2$:Sb, or with other metal dopants from column Va of the periodic table. It can also etch layers based on indium oxide doped with tin ITO, or possibly metal layers, for example made of silver. These layers may be thick or thin, for example from a few nanometres to a few hundred nanometres. They may thus be layers from 20 to 500 rm, in particular at least 40 nm, for example from 200 to 380 nm.

The nature of the layer, and its thickness, should be taken into account for adjusting the concentrations of the corrosively attacking solutions and the etching times (generally of the order of at most a few minutes). The process according to the invention has been found to be particularly effective for etching layers based on $SnO_2$, in particular made of $SnO_2$:F, which have hitherto been know, on the contrary, as being very "hard", chemically resistant, and therefore difficult to etch. This opens up a much more diversified field of applications for this type of layer, in particular in electronics for making electrodes, instead of electrodes usually made of ITO, which perform well but generally need annealing treatments to obtain the requisite level of electrical conduction.

The invention also relates to the application of the process to the manufacture of electrodes/conducting elements in various fields. This may be the glass industry, for example with a view to manufacturing conducting networks for a window heated by the Joule effect, or windows incorporating antennas. This may also involve the photovoltaic cell industry. Lastly, it may involve the electronics industry, with a view to manufacturing front faces or back faces of emissive screens of the flat screen type, screens referred to as plasma screens, or else touch screens, and more generally any type of screen/window which may receive, transmit or emit radiation, in particular visible light.

In the rest of the detailed description, it is assume that all of the substrates used are approximately 2.8 mm thick float glass substrates, for forming front and back faxes of emissive screens of the plasma screen type, having the following chemical composition in proportions by weight:

| | |
|---|---|
| $SiO_2$ | 58% |
| $Al_2O_3$ | 3% |
| $ZrO_2$ | 8% |
| $Na_2O$ | 4.5% |
| $K_2O$ | 7.5% |
| CaO | 8.5% |
| SrO | 9% |
| BaO | 0% |
| $SO_3$ | traces (0.07 to 0.1%) |

This composition leads to a strain point value of about 609° C. and a coefficient of thermal expansion value $\alpha_{(25-300° C.)}$ of about $83.6.10^{-7}$ $C.^{-1}$.

Other glass compositions which are suitable for this type of application are, in particular, described in patents WO 96/11887 and EP 98/400053.9 of Jan. 13, 1997.

A preliminary step, which has not been described in detail here because it is known to the person skilled in the art, consisted in depositing a 270 nm layer of $SnO_2$:F on two glass substrates with dimensions 60 cm×1000 cm, either by a technique of pyrolysis in the gas phase (also referred to as CVD or Chemical Vapour Deposition) directly and continuously on the sheet of float glass, or successively on the cut panes. The aim is to obtain high-resolution etching of the layers to form electrodes in the form of parallel strips which are 1000 cm long and 125 $\mu$m wide. These stripes are grouped in "pairs" of strips which are 175 $\mu$m apart, with a distance of 50 $\mu$m between the two strips in one pair.

The major steps in the etching process of the invention are represented schematically in FIG. 1: the starting point is a glass substrate 1 which is cut and trimmed suitably, then covered with the $SnO_2$:F layer 2.

According to step one, a hot-melt ink is deposited directly with the desired pattern by inkjet printing so as to form the mask 3, deposited in the form of a pair of parallel strips which are 125 $\mu$m wide, 175 $\mu$m apart, and with a distance between the two strips in the same pair equal to 50 $\mu$m, with the desired pattern.

Step two consists in projecting Zn (or Al) powder onto the surface of the masked layer 2, the powder being represented overall by the reference 4 in suspension in a fluid 5.

Step three consists in then projecting a solution having an acidic pH (or basic if Al powder rather than Zn powder was projected onto the layer in the previous step) onto the surface of the masked layer 2: nascent hydrogen is formed which breaks down the layer 2 in its unmasked regions 2'.

The substrate is then rinsed (step four is not shown).

In step five, the mask is removed so as to obtain a layer of $SnO_2$:F etched in a pattern identical to that of the mask, namely strips with the desired pattern.

Examples 1 to 3 below give details of these various steps, in several variants. In all of these examples, the hot-melt ink intended to form the mask 3 is an ink marketed by Markem Corporation under the reference 96206. It has a melting temperature of around 80° C., and its composition comprises polyethylene, polypropylene, polystyrene and ethylene vinyl acetate waxes, an antioxidant and a colorant based on anthraquinone. It is deposited on the substrates using a hot-melt inkjet printer operating by the known principle of a piezoelectric "drop on demand" inkjet, a printer which is marketed by Markem Corporation under the reference Markem 962 and can be programmed by computer.

EXAMPLE 1

Step one is carried out using the ink and its device described above. The mask obtained has a thickness of about 30 to 50 $\mu$m.

Step two is carried out using the mixture consisting of zinc powder (Goodfellow reference ZN006020) and terpineol (Aldrich reference 432628) in proportions of 3:1 by mass. This mixture has the consistency of a relatively fluid oil. It is deposited over the entire layer 2 by screen printing, using a polyester printing screen with a mesh size of 90 and an aperture size of 63 $\mu$m. The mixture is then channeled into the unmasked regions 2' of the layer 2.

Step three consists in etching these regions 2' by immersing the substrate 1 in a bath of etching solution consisting of water, isopropanol and hydrochloric acid (water/isopropanol ratio of 9:1 by volume, and HCl concentration of 6% by volume). The immersion lasts 3 minutes.

The rinsing step four is carried out by immersing the substrate 1 in a second bath, consisting of a water/ethanol mixture.

Step five of removing the mask 3 is carried out by immersing the substrate 1 in a third bath, of trichloromethane.

The $SnO_2$:F layer obtained after these treatments is etched in the desired pattern with high resolution.

EXAMPLE 2

Step one is carried out as in Example 1.

Step two is carried out using a mixture consisting of the same Zn powder as in Example 1, water and aerosil serving as a rheology modifier in respective proportions by mass of 38%, 60.5% and 1.5%. This mixture has the consistency of an aerogel. It is deposited over the entire layer 2 by spraying, using a standard spraying device.

Step three consists in etching these regions 2' by immersing the substrate 1 in a bath of etching solution consisting of water, isopropanol and hydrochloric acid (water/isopropanol ratio of 4/1 by volume, and HCl concentration of 1.5% by volume). The immersion lasts 4 minutes.

The rinsing step four is carried out by immersing the substrate 1 in a bath consisting of water.

Step five of removing the mask is carried out by heat-treating the substrate in a suitably oven at 450° C. for 30 minutes.

The $SnO_2$:F layer obtained is etched with the same quality as that of Example 1.

EXAMPLE 3

Step one is carried out as in Example 1, on an $SnO_2$:F layer which is in this case 130 nm thick.

Step two is carried out using a mixture consisting of aluminum powder (Goodfellow reference LS155124JV) and terpineol used for Example 1, in proportions of 5:3 by mass. This mixture is deposited on the layer 2 by screen printing with the screen according to Example 1, and in the same way.

Step three consists in etching the regions 2' by immersing the substrate 1 in a bath of etching solution consisting of water, ethanol and sodium hydroxide NaOH in a concentration of 1 mol/liter at 50° C. The immersion lasts 5 minutes.

The rinsing step four is carried out by immersing the substrate 1 in a bath consisting of water and 68% by volume of $HNO_3$ for a few seconds, then in ft third bath consisting of water and ethanol.

Step five of removing the mask is carried out as in Example 1.

The $SnO_2$:F layer 3 obtained is such that it is no longer conductive in the etched regions.

To conclude, the process of the invention comprises few steps, in particular by virtue of the way in which the mask is deposited. The pattern of the mask can be changed very easily by suitably programming the computer driving the inkjet printer, and treating substrates with a significant size of, for example, at least 1 m×1 m. Most of the steps can be carried out continuously, with the option of moving the substrate successively from one bath to another, and from one spraying device to another. The removal treatment involving heating as in Example 2 can be integrated in a phase of heat-treating the glass or other coatings which it may have.

It has been possible to verify that the hot-melt inks on which the masks were based showed very good resistance to attack by nascent hydrogen, to acid attack as well as to basic attack. The invention thus allows effective etching of layers based on $SnO_2$, which have hitherto been difficult to etch, and therefore for similar reasons many other layers which are easier to etch, such as ITO layers, etc.

What is claimed is:

1. Process for chemically etching an electrically conductive doped metal oxide layer or a metal layer on a transparent substrate which comprises: depositing a mask comprising at least one hot-melt ink on the electrically conductive doped metal oxide layer or metal layer to be etched; chemically etching the metal oxide layer or metal layer to remove regions that are not covered by the mask; and removing the mask after the regions of the metal oxide layer or metal layer are etched or removed.

2. Process according to claim 1, wherein the hot-melt ink is selected from the group consisting of one or more organic waxes, aliphatic carbon polymers, and polyolefins.

3. Process according to claim 1, wherein the hot-melt ink have a melting temperature of at least about 60° C.

4. Process according to claim 1, wherein the hot-melt ink are insoluble in water.

5. Process according to claim 1, wherein the hot-melt ink or inks are resistant to attack by nascent hydrogen.

6. Process according to claim 1, wherein the mask is deposited using an inkjet printing technique.

7. Process according to claim 1, wherein the regions of the metal oxide layer that are not covered by the mask are removed by nascent hydrogen attack, and optionally, the substrate with the layer is cleaned before removal of the mask.

8. Process according to claim 7, wherein the nascent hydrogen is generated by bringing the regions of the layer which are free of the mask into contact with zinc, and a solution having an acidic pH.

9. Process according to claim 8, wherein the zinc is in powder form and is projected onto the regions of the layer which are free of the mask.

10. Process according to claim 9, wherein the zinc powder is projected onto the unmasked regions of the layer in a liquid, fluid or aerogel phase in suspension in one or more organic and/or aqueous solvents which are optionally provided at least with one rheology-modifying additive.

11. Process according to claim 10, wherein the liquid, fluid or aerogel phase is projected onto the unmasked regions of the layer by a spray technique or by screen printing.

12. Process according to claim 8, wherein the solution having an acidic pH comprises at least one aqueous, alcoholic or aqueous-alcoholic solvent and a strong acid, and optionally contains surfactants.

13. Process according to claim 12, wherein the solution having an acidic pH comprises from about 1 to 20% acid as a percentage by mass.

14. Process according to claim 8, which further comprises bringing the solution having an acidic pH into contact with the unmasked regions of the layer to be etched by immersing the substrate into the solution or by spraying the solution onto the substrate.

15. Process according to claim 7, wherein the nascent hydrogen is generated by bringing the regions of the layer which are free of the mask into contact with aluminum, and a solution having an alkaline pH.

16. Process according to claim 7, wherein the substrate with the layer is cleaned by rinsing the layer using a spray or by immersing the substrate in a solution based on water and/or organic solvents.

17. Process according to claim 7, wherein the mask is removed by dissolving it in an organic solvent, by an ultrasonic treatment, by softening and then peeling it away with mechanical traction, or by using a hot air knife.

18. Process according to claim 7, wherein the mask is removed by a heat treatment which is concomitant with a heat treatment of the substrate and/or of the layer or layers which coat it.

19. Process according to claim 1, wherein the metal oxide layer is based on tin oxide doped with fluorine, arsenic and antimony, or is based on indium oxide doped with element selected from the group consisting of tin.

20. Process according to claim 2, wherein the hot melt ink is selected from the group consisting of paraffin, polyethylene, polypropylene, or polystyrene.

21. Process according to claim 3, wherein the hot-melt ink(s) has a melting temperature of between about 75 and 100° C.

22. Process according to claim 10, wherein the rheology-modifying additive is an aerosil.

23. Process according to claim 13, wherein the solution having an acidic pH comprises from about 1 to 10% acid, as a percentage by mass.

\* \* \* \* \*

UNITED STATES PATENT AND TRADEMARK OFFICE
CERTIFICATE OF CORRECTION

PATENT NO. : 6,379,569 B1
DATED : April 30, 2002
INVENTOR(S) : Rouberol

It is certified that error appears in the above-identified patent and that said Letters Patent is hereby corrected as shown below:

Column 8,
Line 47, insert after "doped with", -- an element selected from the group consisting of --.
Lines 48-49, delete "element selected from the group consisting of".

Signed and Sealed this

Twenty-fourth Day of September, 2002

*Attest:*

JAMES E. ROGAN
*Attesting Officer*  *Director of the United States Patent and Trademark Office*